(12) United States Patent
Chen et al.

(10) Patent No.: US 9,966,971 B2
(45) Date of Patent: *May 8, 2018

(54) CHARACTER CONVERSION

(71) Applicant: INTERNATIONAL BUSINESS MACHINES CORPORATION, Armonk, NY (US)

(72) Inventors: Yao BJ Chen, Beijing (CN); Jian Gang Deng, Beijing (CN); Chao PX Li, Beijing (CN); He Lei Liu, Beijing (CN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/666,736

(22) Filed: Aug. 2, 2017

(65) Prior Publication Data
US 2018/0102787 A1 Apr. 12, 2018

Related U.S. Application Data

(63) Continuation of application No. 15/289,584, filed on Oct. 10, 2016, now Pat. No. 9,806,741.

(51) Int. Cl.
| | | |
|---|---|---|
| *H03M 7/34* | (2006.01) | |
| *H03M 7/40* | (2006.01) | |
| *H03M 7/30* | (2006.01) | |
| *H04L 12/24* | (2006.01) | |
| *H04L 29/08* | (2006.01) | |

(52) U.S. Cl.
CPC ............ *H03M 7/40* (2013.01); *H03M 7/30* (2013.01); *H04L 29/08144* (2013.01); *H04L 41/0213* (2013.01)

(58) Field of Classification Search
CPC . H03M 7/30; H04L 41/0213; H04L 29/08144
USPC .................... 341/51, 50; 709/223, 226
See application file for complete search history.

(56) References Cited

U.S. PATENT DOCUMENTS

| | | | |
|---|---|---|---|
| 2007/0205925 A1 | 9/2007 | Foster | |
| 2013/0185268 A1* | 7/2013 | Kim | G06F 17/30477 707/693 |

FOREIGN PATENT DOCUMENTS

CN 102857230 B 5/2015

OTHER PUBLICATIONS

Chen et al., "Character Conversion", U.S. Appl. No. 15/289,584, filed Oct. 10, 2016 (34 pages).

(Continued)

*Primary Examiner* — Joseph Lauture
(74) *Attorney, Agent, or Firm* — William A. Kinnaman, Jr., Esq.; Kevin P. Radigan, Esq.; Heslin, Rothenberg, Farley & Mesiti, P.C.

(57) ABSTRACT

Methods, devices, and computer programs are provided for character conversion. An original file is compressed, for instance, by a source or target device, to obtain a compressed file. Then, characters in the compressed file are converted from a source code page to a target code page to obtain a converted compressed file. The converted, compressed file may, where applicable, be sent to a target device. Also, the target device may decompress the converted compressed file to obtain a file in the target code page.

20 Claims, 4 Drawing Sheets

(56) References Cited

OTHER PUBLICATIONS

Chen et al., "List of IBM Patents or Patent Applications Treated as Related", U.S. Appl. No. 15/666,584, filed Aug. 2, 2017, dated Aug. 2, 2017 (2 pages).

* cited by examiner

CHARACTER CONVERSION

BACKGROUND

Data may be stored on many different devices in different code pages. There may be a requirement from a user to move data from a source device to a target device. As the code pages used on these two devices may be different, the data may have to be converted to the corresponding code page before saving on the target device. With the business growth, the amount of data has already reached terabytes or even larger for some users. It might be time-consuming to finish the downloading and the conversion.

SUMMARY

Certain shortcomings of the prior art are overcome and additional advantages are provided through the provision of a computer-implemented method, which includes receiving a compressed file. The compressed file includes compression indicators representing character compression information defined, in part, by frequency of characters in a source file from which the compressed filed was obtained. Further, the computer-implemented method includes converting characters in the compressed file from a source code page format to a target code page format to obtain a converted compressed file. The converting characters in the compressed file includes locating characters with reference to the compression indicators representing character compression information, and changing on a per character basis code page numbers representing the characters in the compressed file from the source code page format to the target code page format, where the source code page format and the target code page format are different code page formats. Further, the computer-implemented method includes decompressing the converted compressed file to obtain a target file in the target code page format.

Devices and computer program products relating to one or more aspects are also described and claimed herein. Other embodiments and aspects are described in detail herein and are considered a part of the claimed aspects.

BRIEF DESCRIPTION OF THE DRAWINGS

Through the more detailed description of some embodiments of the present disclosure in the accompanying drawings, the above and other objects, features and advantages of the present disclosure will become more apparent, wherein.

Throughout the drawings, the same or similar reference numerals represent the same or similar elements.

DETAILED DESCRIPTION

Some embodiments will be described in more detail with reference to the accompanying drawings, in which the embodiments of the present disclosure have been illustrated. However, the present disclosure can be implemented in various manners, and thus should not be construed to be limited to the embodiments disclosed herein. On the contrary, those embodiments are provided for the thorough and complete understanding of aspects of the present disclosure, and completely conveying the scope of aspects of the present disclosure to those skilled in the art.

As used herein, the term "includes" and its variants are to be read as open terms that mean "includes, but is not limited to." The term "based on" is to be read as "based at least in part on." The term "one embodiment" and "an embodiment" are to be read as "at least one embodiment." The term "another embodiment" is to be read as "at least one other embodiment." Other definitions, explicit and implicit, may be included below.

Figure 1:
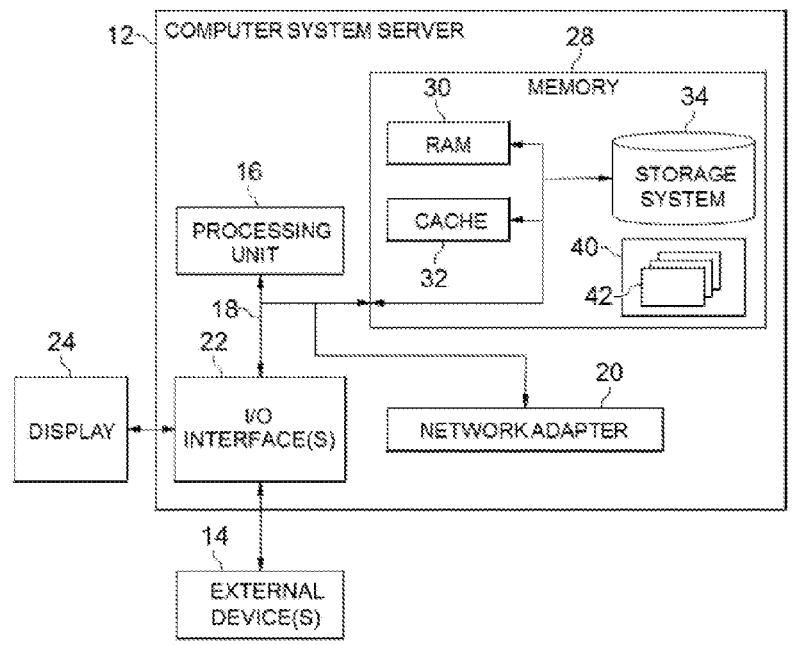
FIG. 1 is a block diagram of an electronic device suitable for implementing embodiments of the present disclosure.

Reference is first made to FIG. 1, in which an example electronic device or computer system/server 12 which is applicable to implement aspects of the present disclosure is shown. Computer system/server 12 is only illustrative and is not intended to suggest any limitation as to the scope of use or functionality of embodiments of the disclosure described herein.

As shown in FIG. 1, computer system/server 12 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the disclosure.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the disclosure as described herein.

Computer system/server 12 may also communicate with one or more external devices 14 such as a keyboard, a pointing device, a display 24, and the like. One or more devices that enable a user to interact with computer system/server 12; and/or any devices (e.g., network card, modem, etc.) that enable computer system/server 12 to communicate with one or more other computing devices. Such communication can occur via input/output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, and the like.

In computer system/server 12, I/O interfaces 22 may support one or more of various different input devices that can be used to provide input to computer system/server 12. For example, the input device(s) may include a user device such as a keyboard, keypad, touch pad, trackball, and the like. The input device(s) may implement one or more natural user interface techniques, such as speech recognition, touch and stylus recognition, recognition of gestures in contact with the input device(s) and adjacent to the input device(s), recognition of air gestures, head and eye tracking, voice and speech recognition, sensing user brain activity, and machine intelligence.

Now embodiments of the present disclosure will be described.

Data may be stored on different devices in different code pages. For example, data of users can be stored on a device, such as a File Transfer Protocol (FTP) server, a website server, a file server, a local server, a cloud server, a personal computer, user equipment (UE), a smart phone, or any other device suitable for data storage now known or later developed. Examples of these devices include, but are not limited to, one or more of the following: computing resources, such as the type, number and frequency of available central processing units (CPUs); storage resources, such as the type, number and size of available memories and disks; input/output (I/O) resources, such as the type, number and graphics acceleration capabilities of available graphics processing units (GPUs); network resources, such as the supported network communication type and available bandwidth; data stored or maintained at the respective device.

The code pages used on the device can be Extended Binary Coded Digital Interchange Code (EBCDIC), American Standard Code for Information Interchange (ASIC), American Standard Code for Information Interchange II (ASIC II), Unicode, or any other code page now known or later developed. In some circumstances, a code page can also be referred to as a character set.

When a user wants to move a file from a source device to a target device, as the code pages used on these two devices may be different, characters of the file may have to be converted from a source code page to a target code page. The source device and the target device may be any device suitable for data storage now known or later developed. The file may be a TXT file, a XML file, a text file or any other kind of file now known or later developed. With the business growth, the amount of data has already reached Tera Bytes or even larger for some users. If the file is very large, it might be time-consuming to finish the downloading and conversion.

Figure 2:
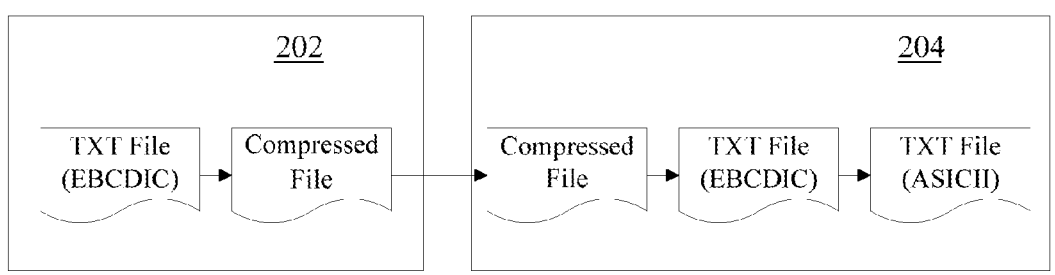
FIG. 2 is a block diagram of an example environment in accordance with embodiments of the present disclosure.

Referring now to FIG. 2, an example environment 200 for character conversion is depicted. For example, a TXT file may be stored on a source device 202 in source code page "EBCDIC". When a user wants to move this file to a target device 204, the source device 202 may transfer the file to the target device. As code page used in the target device 204 is ASCII, characters in the received file have to be converted from EBCDIC to ASC II.

A compression algorithm can be used to reduce the amount of data to be transferred. Many kinds of compression algorithm can be used to compress the file before the transfer, such as a Huffman compression algorithm, Run-length Encoding (RLE) algorithm, or any other algorithm now known or to be developed. The file may be compressed by the source device 202 and then sent to the target device 204. The compressed file can be received and decompressed by the target device 204. Characters of the decompressed file can be converted to ASCII to obtain a file in ASCII. Then the file in ASCII can be saved on the target device 204. However, the workload of character conversion is still very large even after compression has been applied, as characters of the whole decompressed file have to be converted.

In an example, a compression algorithm called "Run-length Encoding" (RLE) may be selected to compress a file. RLE algorithm replaces sequences of a repeating character with only one item of this character followed by its repeating counter. For example, after applying RLE algorithm to a string comprising 40 characters "AAAAAAAAAAAAAAAAAAAAABBBBBBBBBC-CCCCDDDEF", the result string could be "A20B10C5D3E1F1". The length of this string is 14. Even more, digit "1" is unnecessary and can be omitted, then, string "A20B10C5D3EF" is obtained. The length of this string is 12. String "A20B10C5D3EF" can be sent from the source device 202 to the target device 204. Target device 204 may decompress the received string to obtain the original string in length of 40. If the original string is very long, since character conversion still should be done to all characters of the original string, the workload of character conversion is still very large.

Embodiments of the present disclosure provide methods, devices and computer programs to implement character conversion efficiently.

Figure 3:
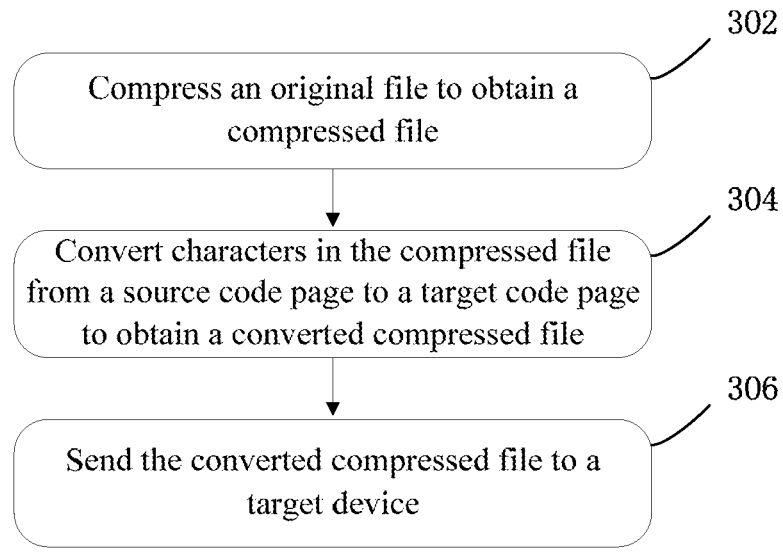
FIG. 3 is a flowchart of an example computer-implemented method for character conversion in accordance with embodiments of the present disclosure.

FIG. 3 shows a flowchart of an example computer-implemented method 300 in accordance with aspects of the present disclosure. In an example, steps of the method can be implemented by one or more processors of a source device.

In step 302, an original file is compressed to obtain a compressed file. The original file may be a file to be transferred from the source device to a target device. Many compression algorithms can be used to compress the original file.

For example, in one type of compression algorithm, a dictionary may be used in the file compression, such as in the Huffman algorithm, etc. Whether a dictionary is being used may be determined according to the selection or determination of the compression algorithm. Each entry of the dictionary includes one or more characters and compression codes corresponding to the characters. In an example, original characters occurring in the original file may be changed to their corresponding compression codes according to the dictionary to obtain compression code sequences. The compressed file may include the dictionary and the compression code sequences. In an example, the compressed file may be a single file which includes the dictionary and the compression code sequences. In this example, the dictionary and the compression code sequences constitute the compressed file. In another example, the compressed file may be a file packet including a file defining the dictionary and a file including the compression code sequences. In this example, the dictionary and the compression code sequences are individual files that constitute the compressed file.

In another type of compression algorithm, such as a Run-Length Encoding (RLE) algorithm, etc., no dictionary is used in file compression, and the obtained compressed file may include original characters occurring in the original file and indicators representing compressing information. In an example of the RLE algorithm, indicators representing compression information may be counters which define consecutive occurring times of characters.

In step 304, characters in the compressed file can be converted from a source code page to a target code page to obtain a converted compressed file. In an example, the source code page is a code page used on the source device, and the target code page is a code page used on the target device. The source code page and the target code page may be any one of the following: Extended Binary Coded Digital Interchange Code (EBCDIC), American Standard Code for Information Interchange (ASIC), American Standard Code for Information Interchange II (ASIC II), or any other code page now known or later developed.

If a dictionary is used in the file compression, the obtained compressed file may include the dictionary and compression code sequences. In this example, converting characters in the compressed file may include: converting characters in the dictionary from the source code page to the target code page to obtain a converted dictionary. The converted compressed file may include the converted dictionary and the compression code sequences.

If no dictionary is used in the file compression, the obtained compressed file may include original characters occurring in the original file and indicators representing compressing information. In this example, converting characters in the compressed file may include: converting the original characters from the source code page to the target code page. The converted compressed file may include the converted original characters and the indicators.

The converted compressed file may be sent to the target device in step 306. For example, many protocols now known or to be developed can be used to transfer the compressed file, such as, FTP, HTTP, etc. In another example, the converted compressed file may be transferred by applications running on devices, such as, social network application, instant messaging application, file sharing application, etc.

In an example, the converted compressed file may be a single file which includes the converted dictionary and the compression code sequences, and sending of the converted compressed file may include: sending this single file to the target device. In another example, the converted compressed file may be a file packet including a file defining the converted dictionary and a file including the compression code sequences. Sending of the converted compressed file may include: sending the file defining the converted dictionary and the file including the compression code sequences together to the target device; or sending the file defining the converted dictionary and the file including the compression code sequences respectively to the target device. In some further examples, sending of the converted compressed file may include: sending the file including the compression code sequences by the source device to the target device; and sending the file defining the converted dictionary by another device to the target device.

Figure 4:
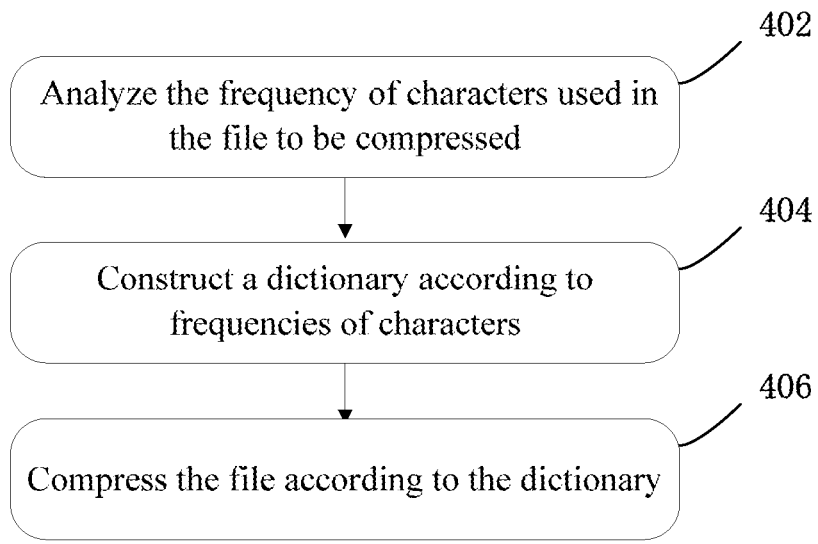
FIG. 4 is a flowchart of an example computer-implemented method for file compression in accordance with embodiments of the present disclosure.

FIG. 4 shows a flowchart of an example computer-implemented method 400 in accordance with one or more embodiments of the present disclosure. For example, method 400 can be included in step 302 of FIG. 3. In step 402, the frequency of occurrence of characters in the original file to be compressed can be analyzed. In an example, the occurrence frequency presents the occurrence times of a character in this file. Then, in step 404, a dictionary may be created according to the occurrence frequencies of characters. Each entry of the dictionary includes one or more characters, which is same as the original characters in the original file, and compression codes corresponding to the characters. In some circumstances, a character with higher occurrence frequency may correspond to a shorter compression code. Characters and their corresponding compression codes are listed in the dictionary. An example dictionary is illustrated in Table 1 below. Each entry of Table 1 includes one or more characters and a corresponding compression code. For example, characters, such as 'b', 'e', 'p', 'th', 'r', r, etc., are represented in hexadecimal (HEX). In another example, more than one character can be listed as an entry. For example, "th" may have a corresponding compression code. In step 406, the file is compressed according to the created dictionary. During the compression, original characters occurring in the original file can be changed to their corresponding compression codes in the dictionary to obtain compression code sequences. As a result, the compressed file may include the dictionary and the compression code sequences.

According to an embodiment of the disclosure, characters in the dictionary may be converted from the source code page to the target code page. For example, a converted dictionary as depicted in Table 2 may be obtained after a conversion to characters in the dictionary depicted in Table 1. In this example, characters in the dictionary, such as 'b', 'e', 'p', 'th', 'r', '!', etc., are converted from "EBCDIC" to "ASCII". A converted compressed file including the converted dictionary and the compression code sequences may be obtained.

TABLE 1

Created Dictionary

| Character (EBCDIC, HEX) | Compression code |
|---|---|
| 82 ('b') | 11 |
| 85 ('e') | 10 |
| 97 ('p') | 101 |
| A3 88 ('th') | 100 |
| 99 ('r') | 1001 |
| 5A ('!') | 1000 |
| ... | ... |

TABLE 2

Converted Dictionary

| Character (ASCII, HEX) | Compression code |
|---|---|
| 62 ('b') | 11 |
| 65 ('e') | 10 |
| 70 ('p') | 101 |
| 74 68 ('th') | 100 |
| 72 ('r') | 1001 |
| 21 ('!') | 1000 |
| ... | ... |

Figure 5:
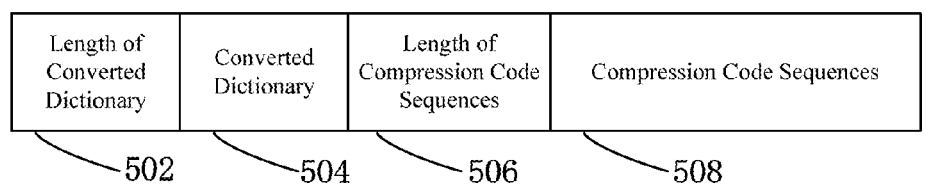
FIG. 5 is an example data structure in accordance with embodiments of the present disclosure.

Referring now to FIG. 5, an example data structure 500 in accordance with embodiments of the present disclosure is depicted. In this example, the compressed file can be created as a data structure. The data structure includes four sections 502-508, wherein section 502 defines length of the converted dictionary, section 504 may be the converted dictionary, section 506 defines length of the compression code sequences, and section 508 may be the compression code sequences. In an example, the data structure can be capsulated into data packets suitable for data transferring.

According to an embodiment of the present disclosure, the target device may, in response to receiving the converted compressed file, decompress the received converted compressed file to obtain a file in the target code page.

In an example, the received converted compressed file includes the converted dictionary and the compression code sequences. The received converted compressed file is decompressed according to the converted dictionary. During the decompression, each compression code in the compression code sequences may be changed to its corresponding characters according to the converted dictionary, and a decompressed file may be obtained. The dictionary has been converted to the target code page by the source device previously, so the decompressed file is in the target code page and the target device do not need to implement character conversion. Then, the decompressed file may be saved onto the target device.

In another example, the received converted compressed file includes the converted original characters and the indicators representing compressing information. The decompression is implemented using indicators representing compression information and a decompressed file may be obtained. The converted original characters have been in the target code page, so the decompressed file is in the target code page and the target device does not need to implement character conversion.

According to an embodiment of the present disclosure, the source device may receive information indicating the target code page used on the target device. For example, the source device may receive a message from the target device. The message indicates the target code page used on the target device. In this example, the source device can use this message to determine the target code page. In another example, the message can be received by the source device from a server or another device. In yet another example, the information can be input into the source device by a user, wherein the information indicates the target code page.

According to embodiments of the disclosure, characters conversion is applied only to characters in the compressed file, so the workload of characters conversion can be reduced substantially and the time of conversion can be decreased greatly. Besides, the source device may has stronger processing ability than the target device in many circumstances, and the characters conversion can be done by the source device with stronger processing ability, so the processing efficiency can be further improved.

Figure 6:
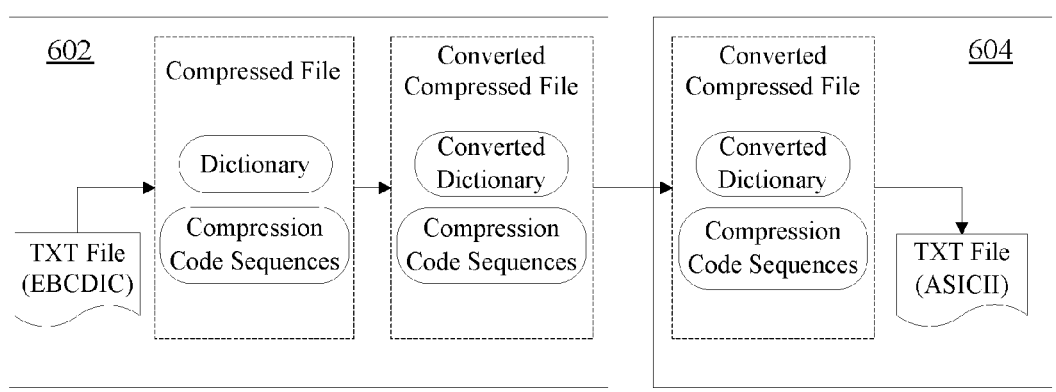
FIG. 6 is another block diagram of an example environment in accordance with embodiments of the present disclosure.

Referring now to FIG. 6, an example environment 600 for character conversion is depicted. For example, an original TXT file with code page "EBCDIC" is compressed with a compression algorithm by a source device 602, wherein a dictionary is used in the file compression. Original characters in the original file are changed to their corresponding compression codes according to the dictionary and a compression code sequences may be obtained. A compressed file including the dictionary and compression code sequences is obtained after the compression. Then, characters in the dictionary can be converted from source code page "EBCDIC" to target code page "ASCII". The converted compressed file may be sent to a target device 604. The target device 604 can decompress the received converted compressed file according to the converted dictionary to directly obtain a TXT file in "ASCII". The TXT file in "ASCII" can be saved onto the target device 604. Sometimes, the original TXT file in "EBCDIC" may be very large. For example, the dictionary used in the compression may just include several hundreds of or even less entries while the original TXT file is in Giga Bytes level. As character conversion only has to be applied to characters in the dictionary, the workload of characters conversion can be reduced substantially.

Figure 7:
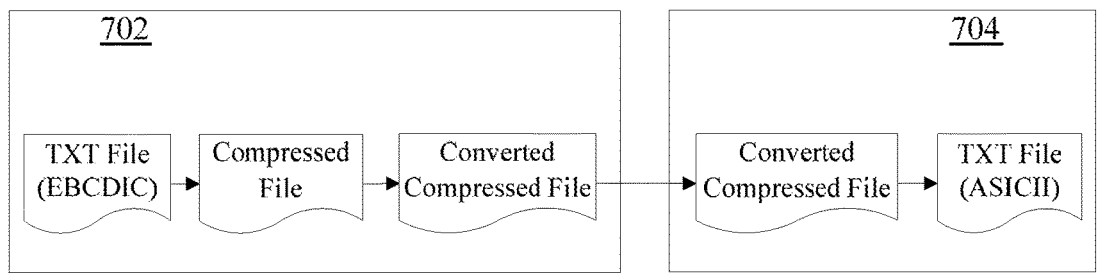
FIG. 7 is another block diagram of an example environment in accordance with embodiments of the present disclosure.

Referring now to FIG. 7, an example environment 700 for character conversion is depicted. For example, in a source device 702, a TXT file with code page "EBCDIC" is compressed and no dictionary is used in the file compression. The compressed file includes original characters and indicators representing the compression information. In an example, compressed string "A20B10C5D3EF" can be obtained after compression to the original string "AAAAAAAAAAAAAAAAAAAABBBBBBBBBBC-CCCCDDDEF". Then, original characters in the compressed file can be converted from "EBCDIC" to "ASCII". As original characters in the compressed string, such as A, B, C, D, E or F, are to be converted from "EBCDIC" to "ASCII", only 6 characters have to be converted. The converted compressed file can be sent to the target device 704. The target device 704 can decompress the converted compressed file to obtain a TXT file in "ASCII" directly. Then, the ASCII TXT file can be saved on target device 704. As conversion only have to be applied to characters of the compressed file, the workload of characters conversion can be reduced substantially.

According to embodiments of the present disclosure, character conversion can also be implemented by a target device. For example, a source device may compress an original file to be transferred. Then a compressed file can be obtained after the file compression, and the compressed file may be sent to the target device directly.

There are two main kinds of algorithms. In an example, a dictionary may be used in the file compression in one kind of algorithms, such as the Huffman compression algorithm, etc. Each entry of the dictionary includes one or more characters and compression code corresponding to the characters. Original characters in the original file may be replaced by their corresponding compression codes according to the dictionary to obtain compression code sequences. The compressed file may include the dictionary and the compression code sequences. In an example, the compressed file may be a single file which includes the dictionary and the compression code sequences, and this single file may be sent to the target device. In another example, the compressed file may be a file packet including a file defining the dictionary and a file including the compression code sequences. In this example, sending the compressed file may include: sending the file defining the dictionary and the file including the compression code sequences together to the target device; or sending the file defining the dictionary and the file including the compression code sequences respectively to the target device. In some further examples, sending of the compressed file may include: sending the file including the compression code sequences by the source device to the target device; and sending the file defining the converted dictionary by another device to the target device.

In another kind of algorithm, no dictionary may be used in the file compression, such as with the Run-Length Encoding (RLE) algorithm, etc. The compressed file includes original characters occurring in the file before the file compression and indicators representing compression information.

As described herein, embodiments of the present disclosure provide methods, devices, and computer programs for character conversion.

As noted, in an aspect, a computer-implemented method is provided. According to aspects of the method, an original file is compressed to obtain a compressed file. Then, characters in the compressed file are converted from a source code page to a target code page to obtain a converted compressed file. The converted compressed file is sent to a target terminal.

In another aspect, a computer-implemented method is provided. According to aspects of the method, a compressed file is received from a source device. Then, characters in the received compressed file are converted from a source code page to a target code page to obtain a converted compressed file. The converted compressed file is decompressed by the target device to obtain a file in the target code page.

In yet another aspect, a device is provided. The device includes a processing unit and a memory coupled to the processing unit and storing instructions thereon. The instructions, when executed by the processing unit, perform acts including: compressing an original file to obtain a compressed file; converting characters in the compressed file from a source code page to a target code page to obtain a converted compressed file; and sending the converted compressed file to a target device.

In yet another aspect, a device is provided. The device includes a processing unit and a memory coupled to the processing unit and storing instructions thereon. The instructions, when executed by the processing unit, performs acts including: receiving a compressed file from a source device; converting characters in the received compressed file from a source code page to a target code page to obtain a converted compressed file; and decompressing the converted compressed file to obtain a file in the target code page.

In yet another aspect, a computer program product is provided. The computer program product is tangibly stored on a non-transient machine-readable medium and comprising machine-executable instructions. The instructions, when executed on a device, cause the device to perform the steps of methods according to embodiments of the present disclosure.

Figure 8:
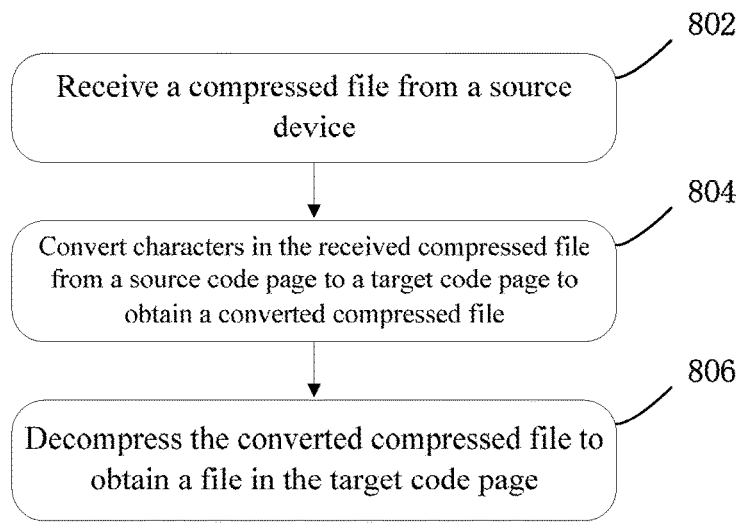
FIG. 8 is a flowchart of an example computer-implemented method for character conversion in accordance with embodiments of the present disclosure.

FIG. 8 shows a flowchart of an example computer-implemented method 800 in accordance with embodiments of the present disclosure. The method 800 can be carried out by a target device. In an example, steps of the method can be implemented by one or more processors of a target device. In step 802, a compressed file is received by a target device from a source device. In step 804, characters in the received compressed file are converted from a source code page to a target code page to obtain a converted compressed file. Then, in step 806, the converted compressed file is decompressed to obtain a file in the target code page. In an example, the source code page is a code page used on the source device and the target code page is a code page used on the target device.

In an example, the received compressed file may include a dictionary and compression code sequences. In this example, converting characters in the compressed file from the source code page to the target code page may include: converting characters in the dictionary from the source code page to the target code page to obtain a converted dictionary. The converted compressed file may include the converted dictionary and the compression code sequences. Then, the received compressed file is decompressed according to the converted dictionary to obtain a file in the target code page. In an example, each compression code in the compression code sequences may be changed to their corresponding characters according to the converted dictionary and a decompressed file can be obtained.

In another example, the received compressed file may include original characters occurring in the original file and indicators representing compressing information. In this example, converting characters in the compressed file from the source code page to the target code page may include: converting the original characters from the source code page to the target code page to obtain a converted compressed file. The received compressed file may be decompressed according to the indicators representing compression information.

According to embodiments of the present disclosure, information indicating a compression algorithm used by the source device can be obtained by the target device.

According to an embodiment of the present disclosure, a device is provided. The device includes a processing unit and a memory coupled to the processing unit and storing instructions thereon, the instructions, when executed by the processing unit, performing acts including: compressing an original file to obtain a compressed file; converting characters in the compressed file from a source code page to a target code page to obtain a converted compressed file; and sending the converted compressed file to a target device.

According to an embodiment of the present disclosure, the converting characters in the compressed file from the source code page to the target code page may include: in response to the compressed file including a dictionary and compression code sequences, converting characters in the dictionary from the source code page to the target code page to obtain a converted dictionary.

According to an embodiment of the present disclosure, the converting characters in the compressed file from the source code page to the target code page may include: in response to the compressed file including original characters occurring in the original file and indicators representing compression information, converting the original characters in the compressed file from the source code page to the target code page.

According to an embodiment of the present disclosure, the converted compressed file sent to the target device is decompressed by the target device to obtain a file in the target code page.

According to an embodiment of the present disclosure, the acts further includes: receiving information indicating a target code page used on the target device.

According to an embodiment of the present disclosure, a device is provided. The device includes a processing unit and a memory coupled to the processing unit and storing instructions thereon, the instructions, when executed by the processing unit, performing acts including: receiving a compressed file from a source device; converting characters in the received compressed file from a source code page to a target code page to obtain a converted compressed file; and decompressing the converted compressed file to obtain a file in the target code page.

According to an embodiment of the present disclosure, the converting characters in the received compressed file from the source code page to the target code page may include: in response to the received compressed file including a dictionary and compression code sequences, converting characters in the dictionary from the source code page to the target code page to obtain a converted dictionary.

According to an embodiment of the present disclosure, the decompressing the converted compressed file may include: decompressing the converted compressed file according to the converted dictionary.

According to an embodiment of the present disclosure, the converting characters in the received compressed file from the source code page to the target code page may includes: in response to the received compressed file including original characters occurring in the original file and indicators representing compression information, converting the original characters in the compressed file from the source code page to the target code page.

According to an embodiment of the present disclosure, a computer program product is provided. The computer program product is tangibly stored on a non-transient machine-readable medium and including machine-executable instructions, the instructions, when executed on a device, causing the device to perform the steps: compressing an original file to obtain a compressed file; converting characters in the compressed file from a source code page to a target code page to obtain a converted compressed file; and sending the converted compressed file to a target device.

According to an embodiment of the present disclosure, the converting characters in the compressed file from the source code page to the target code page may include: in response to the compressed file including a dictionary and compression code sequences, converting characters in the dictionary from the source code page to the target code page to obtain a converted dictionary.

According to an embodiment of the present disclosure, the converting characters in the compressed file from the source code page to the target code page may include: in response to the compressed file including original characters occurring in the original file and indicators representing compression information, converting the original characters in the compressed file from the source code page to the target code page.

According to an embodiment of the present disclosure, the converted compressed file sent to the target device is decompressed by the target device to obtain a file in the target code page.

According to an embodiment of the present disclosure, the steps further includes: receiving information indicating a target code page used on the target device.

According to an embodiment of the present disclosure, a computer program product is provided. The computer program product is tangibly stored on a non-transient machine-readable medium and including machine-executable instructions, the instructions, when executed on a device, causing the device to perform the steps: receiving a compressed file from a source device; converting characters in the received compressed file from a source code page to a target code page to obtain a converted compressed file; and decompressing the converted compressed file to obtain a file in the target code page.

According to an embodiment of the present disclosure, the converting characters in the received compressed file from the source code page to the target code page may include: in response to the received compressed file including a dictionary and compression code sequences, converting characters in the dictionary from the source code page to the target code page to obtain a converted dictionary.

According to an embodiment of the present disclosure, the decompressing the converted compressed file may include: decompressing the converted compressed file according to the converted dictionary.

According to an embodiment of the present disclosure, the converting characters in the received compressed file from the source code page to the target code page may includes: in response to the received compressed file including original characters occurring in the original file and indicators representing compression information, converting the original characters in the compressed file from the source code page to the target code page.

The present disclosure may be a system, an apparatus, a device, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams illustrate the architecture, functionality, and operation of possible implementations of systems, methods and computer program products according to various embodiments of the present disclosure. In this regard, each block in the flowchart or block diagrams may represent a module, snippet, or portion of code, which includes one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reversed order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method, comprising:
    receiving a compressed file, the compressed file comprising compression indicators representing character compression information defined, in part, by frequency of characters in a source file from which the compressed file was obtained;
    converting characters in the compressed file from a source code page format to a target code page format to obtain a converted compressed file, wherein the converting characters in the compressed file comprises locating characters with reference to the compression indicators representing character compression information, and changing on a per-character basis code page numbers representing the characters in the compressed file from the source code page format to the target code page format, the source code page format and the target code page format being different code page formats; and
    decompressing the converted compressed file to obtain a target file in the target code page format.

2. The computer-implemented method of claim 1, wherein the converting characters in the compressed file from the source code page to the target code page comprises, based on the compressed file comprising a dictionary and compression code sequences, converting characters in the dictionary from the source code page to the target code page to obtain a converted dictionary.

3. The computer-implemented method of claim 2, wherein the decompressing the converted compressed file comprises decompressing the converted compressed file according to the converted dictionary.

4. The computer-implemented method of claim 1, wherein the indicators representing character compression information comprise information on sets of continuous characters in the source file.

5. The computer-implemented method of claim 1, wherein the receiving the compressed file comprises receiving the compressed file at a target device from a source device.

6. The computer-implemented method of claim 5, wherein the compressed file was generated at the source device.

7. The computer-implemented method of claim 5, further comprising:
receiving information indicating the source code page format used at the source device.

8. The computer-implemented method of claim 1, wherein the decompressing comprises inputting converted characters into the target file with reference to the compression indicators representing character compression information.

9. The computer-implemented method of claim 8, wherein the converted characters inputted into the target file have a same frequency in the target file as in the source file prior to the converting.

10. A device comprising:
a processing unit; and
a memory coupled to the processing unit and storing instructions thereon, the instructions, when executed by the processing unit, performing a method including:
receiving a compressed file, the compressed file comprising compression indicators representing character compression information defined, in part, by frequency of characters in a source file from which the compressed file was obtained;
converting characters in the compressed file from a source code page format to a target code page format to obtain a converted compressed file, wherein the converting characters in the compressed file comprises locating characters with reference to the compression indicators representing character compression information, and changing on a per-character basis code page numbers representing the characters in the compressed file from the source code page format to the target code page format, the source code page format and the target code page format being different code page formats; and
decompressing the converted compressed file to obtain a target file in the target code page format.

11. The device of claim 10, wherein the converting characters in the compressed file from the source code page format to the target code page format comprises, based on the compressed file comprising a dictionary and compression code sequences, converting characters in the dictionary from the source code page format to the target code page format to obtain a converted dictionary.

12. The device of claim 11, wherein the decompressing the converted compressed file comprises decompressing the converted compressed file according to the converted dictionary.

13. The device of claim 10, wherein the indicators representing character compression information comprises information on sets of continuous characters in the source file.

14. The device of claim 10, wherein the receiving the compressed file comprises receiving the compressed file at a target device from a source device.

15. The device of claim 14, wherein the compressed file was generated at the source device.

16. The device of claim 14, further comprising:
receiving information indicating the source code page format used at the source device.

17. The device of claim 10, wherein the decompressing comprises inputting converted characters into the target file with reference to the compression indicators representing character compression information.

18. The device of claim 17, wherein the converted characters inputted into the target file have the same frequency in the target file as in the source file prior the converting.

19. A computer program product for processing a compressed file, the computer program product comprising:
a computer-readable storage medium having program instructions embodied therewith, the program instructions being executable by a processing unit to cause the processing unit to perform a method comprising:
receiving a compressed file, the compressed file comprising compression indicators representing character compression information defined, in part, by frequency of characters in a source file from which the compressed file was obtained;
converting characters in the compressed file from a source code page format to a target code page format to obtain a converted compressed file, wherein the converting characters in the compressed file comprises locating characters with reference to the compression indicators representing character compression information, and changing on a per-character basis code page numbers representing the characters in the compressed file from the source code page format to the target code page format, the source code page format and the target code page format being different code page formats; and
decompressing the converted compressed file to obtain a target file in the target code page format.

20. The computer program product of claim 19, wherein the converting characters in the compressed file from the source code page format to the target code page format comprises, based on the compressed file comprising a dictionary and compression code sequences, converting characters in the dictionary from the source code page format to the target code page format to obtain a converted dictionary.

* * * * *